United States Patent [19]
Kim

[11] Patent Number: 5,524,115
[45] Date of Patent: Jun. 4, 1996

[54] INPUT/OUTPUT SELECTION CIRCUIT OF COLUMN REPAIR

[75] Inventor: Seung-Min Kim, Seoul, Rep. of Korea

[73] Assignee: Hyundai Electronics Industries, Co., Ltd., Kyoungki-do, Rep. of Korea

[21] Appl. No.: 998,060

[22] Filed: Dec. 29, 1992

[30] Foreign Application Priority Data

Dec. 31, 1991 [KR] Rep. of Korea .................. 91-25756

[51] Int. Cl.$^6$ .................................................. G11C 29/00
[52] U.S. Cl. .................................................. 371/10.3
[58] Field of Search .................. 371/10.3, 10.2, 371/10.1; 364/255.1; 365/200

[56] References Cited

U.S. PATENT DOCUMENTS 4,566,081  1/1986  Ochii ........................ 365/200
4,773,046  9/1988  Akaogi et al. ............... 365/96
5,134,585  7/1992  Murakami et al. ........... 365/200
5,224,071  7/1993  O'Connell et al. ........ 365/189.04
5,227,997  7/1993  Kikuda et al. .......... 365/189.08

FOREIGN PATENT DOCUMENTS 0083212  7/1983  European Pat. Off. ....... G06F 11/20

*Primary Examiner*—Robert W. Beausoliel, Jr.
*Assistant Examiner*—Norman M. Wright
*Attorney, Agent, or Firm*—Morgan & Finnegan

[57] ABSTRACT

An Input/Output selection circuit of column repair which selects only one Input/Output piece from an n-piece Input/Output decoder circuit according to the state of an m-piece selective Input/Output fuse from a selective Input/Output circuit and which selects only the failed Input/Output from n-pieces of Input/Output with one spare column, where m, n are integers, and n=$2^m$. Only 0–3 piece(s) of fuse is cut in the case where there are 8 pieces of Input/Output.

2 Claims, 3 Drawing Sheets

|  | CUTTING OF 1ST I/O FUSE | CUTTING OF 2ND FUSE | CUTTING OF 3RD FUSE |
|---|---|---|---|
| I/o 1 | ◯ | ◯ | ◯ |
| I/o 2 | ◯ | ◯ |  |
| I/o 3 | ◯ |  | ◯ |
| I/o 4 | ◯ |  |  |
| I/o 5 |  | ◯ | ◯ |
| I/o 6 |  | ◯ |  |
| I/o 7 |  |  | ◯ |
| I/o 8 |  |  |  |

INPUT/OUTPUT SELECTION CIRCUIT OF COLUMN REPAIR

BACKGROUND OF THE INVENTION

1. Field of the Invention

This invention relates to an Input/Output selection circuit for column repair, and more particularly, relates to an Input/Output selection circuit for column repair, in which only a few fuses are blown for selecting an Input/Output from a plurality of Input/Output from a plurality of Input/Outputs.

2. Description of the Prior Art

Generally, in a memory device operating a plurality of Input/Output using one address (e.g., byte wide), the failed Input/Output should be selected among a plurality of Input-out with one number of spare columns. If an Input/Output selection circuit is not employed, the spare column should be required in proportion to the number of Input/Output, thus enlarging the layout area.

A prior art Input/Output selection circuit of column repair, as illustrated in FIG. 1, has the following structure:

An input of two spare bits of SB and $\overline{SB}$ is commonly given to the drain; the source of n pair of NMOS transistor NM11, NM12; NM21; NM22; ... NMn1, NMn2 is respectively connected with each of data bus DB1;-DB$^n$, $\overline{DBn}$; the respective gates of these transistor pairs are connected to ground through the resistor R1–Rn, while the connection point between the gates of each transistor pair is given ready signal, $\emptyset\,\overline{REDY}$ through inverter I1 after passing n-piece of fuse F1–Fn. Thus, in accordance with this prior art, Input/Output selection part, selecting the failed Input/Output among n-piece of Input/Output is equally fabricated with n-piece.

As for the technical operation of prior art as fabricated above, if the repaired address is selected, a ready signal $\emptyset\,\overline{REDY}$ is in the low level whereas if the repaired address is not selected, a ready signal $\emptyset\,\overline{REDY}$ is in the high level.

Since the bit line SB, $\overline{SB}$ of one more spare column is applied to the drain terminal (i.e. for each Input/Output) of n pair of NMOS transistors NM11; ... NMn1, NMn2 or if, for example, 'I/O 1' from n-piece of Input/Output I/O 1 to I/O n is failed, the remaining fuse from F1 to Fn excluding fuse F1, that is, n–1 piece of fuse, should be blown, as the remaining Input/Output fuse excluding the failed Input/Output from n-piece of fuse F1 to Fn should be blown.

Not that the fuse F-2 are blown, the gate voltage of NMOS transistors NM11, NM12; NM21, NM22; ... NMn2, NMn2 is in the low level by the grounded resistors R2–Rn so that the line information of spare bit line SB, $\overline{SB}$ is not delivered to data bus DB2, $\overline{DB2}$; ... DBn, $\overline{DBn}$.

Meantime, in case that the Input/Output I/O 1 is repaired, the gate node point of NMOS transistor NM11, NM12 is controlled by ready signal $\emptyset\,\overline{REDY}$ because the fuse F1 is not blown. Among the failed Input/Output, therefore, only the 1st Input/Output I/O 1 is controlled by a ready signal $\emptyset\,\overline{REDY}$ and thus, only Input/Output I/O 1 is repaired. Since the said conventional Input/Output selection circuit of column repair has to blow n–1 piece of fuse per spare column all the time, however, a lot of space columns should be necessary in the high integrated memory device, thus generating an excessive number of fuse blowing.

SUMMARY OF THE INVENTION

In an attempt to overcome the disadvantages of prior art, it is a principle object of the present invention to provide an Input/Output selection circuit of column repair which can select only one Input/out from n-piece of Input/Output decoding in accordance with selective Input/Output fuse by taking advantage of m-piece of selective Input/Output fuse and n-piece of basic Input/Output decoder part and 2n piece of spare transfer integrated memory device is n-piece. Here, m, n is integers, and n=2$^m$. In accordance with the present invention, in order to repair a given Input/Output, a number of fuses that need to be blown will range from 0 to m.

DETAILED DESCRIPTION OF THE PREFERRED EMBODIMENT

To make the description more clear, a reference is made to the accompanying drawings.

Figure 1:
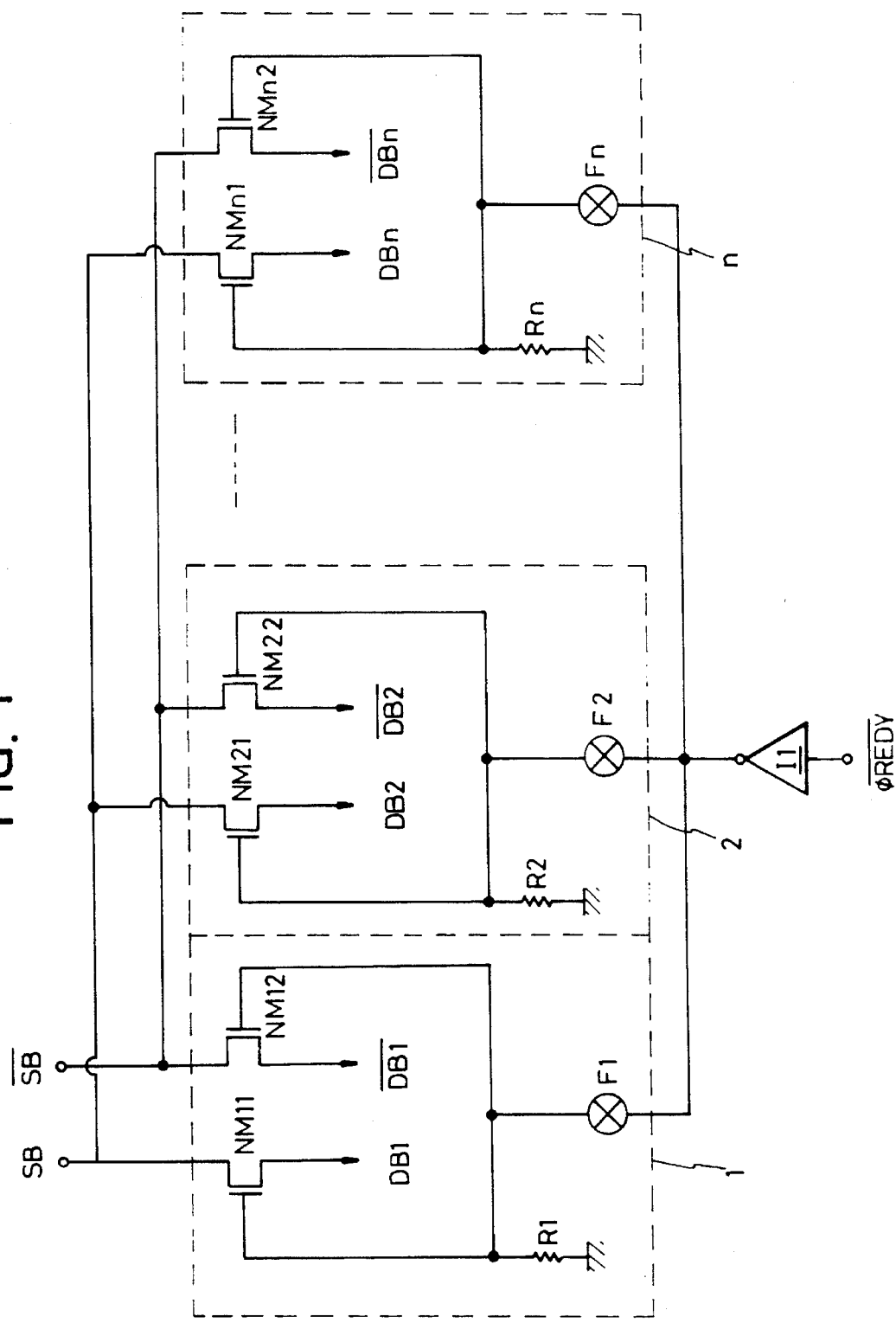
FIG. 1 is an Input/Output selection circuit diagram for an conventional column repair.
Figure 2:
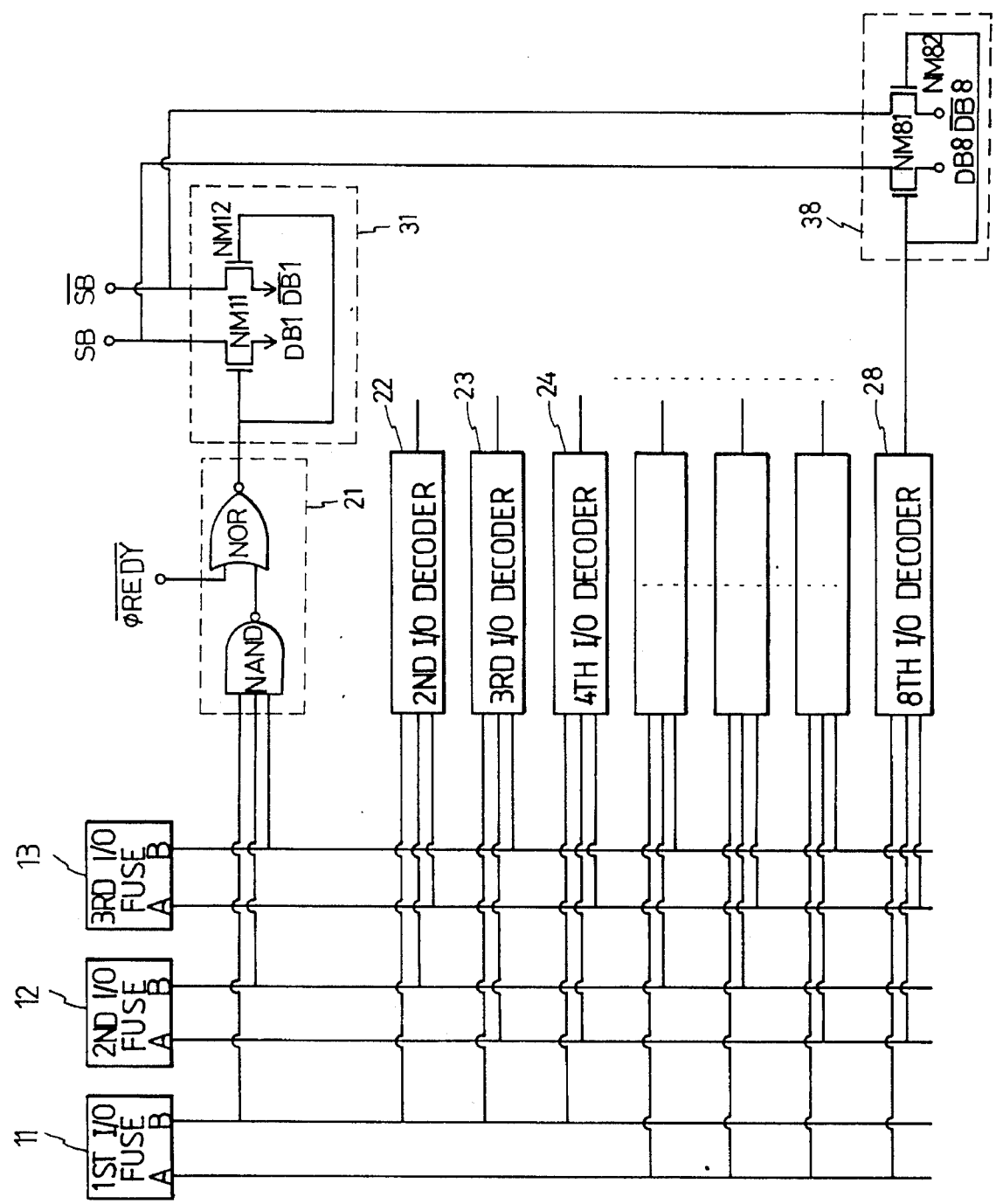
FIG. 2 is an Input/Output selection circuit diagram of the column repair according to the present invention.
Figures 3, 4:
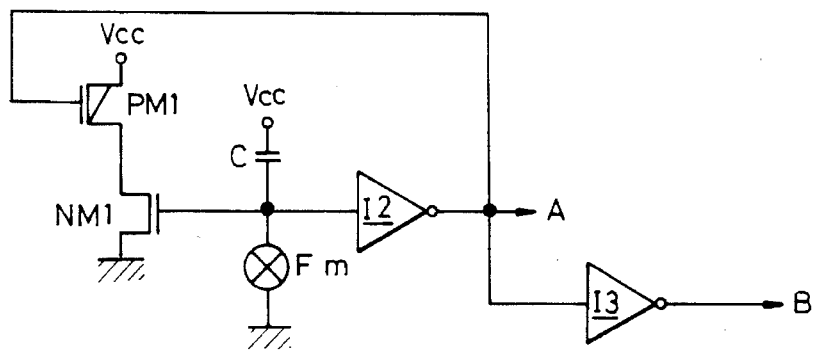
FIG. 3 is a detailed circuit diagram of selective Input/Output fuse as illustrated in FIG. 2.
FIG. 4 is a logical table of selective Input/Output fuse according to the present invention.

FIG. 2 is an Input/Output selection diagram of the column repair of the present invention, and FIG. 3 is a detailed circuit diagram of the selective Input/Output fuse based upon FIG. 2. The feature of fabrication is shown below:

The drain of PMOS transistor PM1 and NMOS transistor NM1 are commonly connected; the gate of NNOS transistor NM1 is connected to the output terminal A through the inverter I2, to one terminal of the condenser C, and to ground through fuse Fm; and the gate of the PMOS transistor PM1 is connected to output terminal A, and to terminal B through inverter I3. In accordance with this circuit configuration, the first selective Input/Output fuse 11 has a high level (e.g., logic level) at either output terminal A or B, depending on whether one fuse is blow or not blown, respectively;

The 2nd and 3rd selective Input/Output fuse 12, 13 are fabricated equivalently to the 1st selective Input/Output fuse 11;

The 2nd to 8th Input/Output decoder part 22 to 28 are fabricated equivalently to the 1st Input/Output decoder part 21, which comprises: i) a NAND gate receiving one line as input from one of the output lines for each 1st to 3rd selective Input/Output fuse 11 to 13, and ii) a NOR gate receiving the ready signal the ready signal Ø REDY controlling the address to be repaired, and receiving the output of the NAND gate. It is understood that each NOR gate of each Input/Output decoder part 21–28 receives the same Ø REDY signal which is active low when a particular memory address is selected corresponding to a repaired address.

The 1st spare transfer part 31 receives the Output signal from 1st Input/Output decoder part 21. This output signal is applied to the gate of NMOS transistor NM11, NM12, the drain and the source connected to spare bit SB, $\overline{SB}$ and data bus DB, $\overline{DB}$;

The 2nd to the 8th spare transfer part 32 to 38 transmit the information of the spare bit each according to a respective signal from the said 2nd to the 8th Input/Output decoder part 22 to 28, in the same manner as described for the 1st spare transfer part 31.

The application and the effect of the present invention as fabricated as above can be described below based upon the logical Input/Output table of FIG. 4.

First of all, if each fuse is blown in the 1st to 3rd selective Input/Output fuse 11 to 13, the output terminal A and B of all selective Input/Output fuse 11 to 13 are in the low and high level, respectively. Thus, all the inputs of the NAND gate of the 1st Input/Output decoder part 21 are in the high level. Since for each of the remaining 2nd to 8th Input/Output decoder part 22 to 28 the respective NAND gate has at least one low level input, the NAND gate output of the 1st Input/Output decoder part 21 is the only NAND output in the low level among all the NAND gate outputs of the 1st to the 8th Input/Output decoder parts 21 to 28. Therefore, when a low level ready signal Ø REDY (i.e., active low) is applied to one input of each NOR gate among Input/Output decoder part 21 to 28, the only I/O decoder part that will be high is I/O decoder part 21, and concommitantly only the gate input of NMOS transistor NM11, NM12 within the 1st spare transfer part 31 is in the high level and will turn on. Thus, the information of spare bit SB, SB passes through the NMOS transistor NM11, NM12 to data bus DB1, DB1, which is connected to the source terminal of these transistors. Moreover, it is understood from the foregoing that the transmission of information is not made available with the remaining data bus DB2, DB2 or DB8, DB8. In accordance with the present invention, therefore, one Input/Output from 8 pieces of Input/Output is selected to receive SB, SB information from a spare column based upon which of selective Input/Output fuse, as shown in FIG. 4. It is understood, however, that in accordance with the present invention, anyone of Input/Output fuse, where $N=2^m$. It is further understood that M is the maximum number of fuses that must be blown in order to select a given Input/Output from the N possible Input/Output.

As described above in more detail, the prior art has recognized disadvantages in that in case where there are 8 pieces of Input/Output, 7 pieces of fuse should be cut regardless of which Input/Output is selected. According to the present invention, however, only 0–3 piece(s) of fuse is cut based upon selected Input/Output and a lot of spare columns are not necessary, thus reducing the layout area and making it an easy application for high-integrated technology hereof.

What is claims:

1. An Input/Output selection circuit for column repair, corresponding to a predetermined repair address, for providing a spare bit to an input/output of a data bus having a plurality of input/outputs comprising:

first to third selective Input/Output fuse circuits, each having two complementary output signals according to the state of a respective fuse associated with each one of said Input/Output fuse circuits;

first to eighth Input/Output decoders, each generating a first decoder output signal according to a logical NAND combination of one of said two complementary output signals from each said Input/Output fuse circuits, and each generating a second decoder output signal according to a logical NOR combination of said first decoder output signal and a ready signal generated when said repair address is selected; and first to eighth spare transfer part, each responsive to a respective said second decoder output signal, for providing said spare bit to one of said input/output of said data bus.

2. An Input/Output selection circuit for column repair, as claimed in claim 1, wherein each of said first selective Input/Output fuse circuits comprises: a first PMOS transistor, a second NMOS transistor, a condenser, a fuse, and a first and second inverter, in which the drains of said first PMOS transistor and said second NMOS transistor are connected; the gate of said second NMOS transistor is connected to one terminal of said condenser, a second terminal of said condenser is connected to a power supply, said fuse is grounded and connected to said one terminal of said condenser, said first inverter having an input connected to said one terminal of said condenser and an output connected to an input of said second inverter and to the gate of said first PMOS transistor, whereby the input of said second inverter is connected to the gate of said first PMOS transistor and thereby said second inverter having an output that is complementary to the output of said first inverter.

* * * * *